United States Patent [19]
Power

[11] Patent Number: 4,736,327
[45] Date of Patent: Apr. 5, 1988

[54] DATA DISPLAY METHOD AND APPARATUS

[75] Inventor: Francis M. Power, Farnborough, England

[73] Assignee: Schlumberger Electronics (U.K.) Limited, Farnborough, England

[21] Appl. No.: 708,484

[22] Filed: Apr. 12, 1985

[51] Int. Cl.⁴ .................... G06F 15/20; G09G 1/06; G01R 1/00

[52] U.S. Cl. .................... 364/481; 340/731; 324/111; 324/77 R

[58] Field of Search ........... 364/481; 340/722, 728, 340/747, 753, 731; 324/111, 112, 121 R, 77 B, 77 R; 368/115

[56] References Cited

U.S. PATENT DOCUMENTS

| 4,034,291 | 7/1977 | Allen et al. | 324/121 R |
| 4,038,668 | 7/1977 | Quarton | 340/722 X |
| 4,053,831 | 10/1977 | Furukawa et al. | 324/121 R X |
| 4,072,851 | 2/1978 | Rose | 324/77 R X |
| 4,181,943 | 1/1980 | Mercer, Sr. et al. | 364/426 |
| 4,198,683 | 4/1980 | Dagostino | 364/900 |
| 4,507,740 | 3/1985 | Star et al. | 324/77 R X |
| 4,540,938 | 9/1985 | Bruce | 324/121 R |
| 4,553,091 | 11/1985 | Bristol | 324/121 R X |
| 4,574,278 | 3/1986 | Apelman | 324/121 R X |
| 4,608,652 | 8/1986 | Yokokawa et al. | 364/481 X |

FOREIGN PATENT DOCUMENTS

| 0101158 | 2/1984 | European Pat. Off. . |
| 2515358 | 4/1983 | France . |
| 2029972 | 3/1980 | United Kingdom . |
| 2064243 | 6/1981 | United Kingdom . |
| 2099648 | 12/1982 | United Kingdom . |
| 2124457 | 2/1984 | United Kingdom . |
| 2128858 | 5/1984 | United Kingdom . |

OTHER PUBLICATIONS

"On-Board Digital Processing Refines Scope Measurements", (Garuts and Tallman), Electronics, vol. 53(1980), pp. 105-114.

"The Enhancement of Oscilloscope Applications by the Synthesis of Signal Processing and IEEE-488 Capabilities", (Rousseau) 8079 Electro/80 Conference Record, pp. 1-5, vol. 5.

Primary Examiner—Parshotam S. Lall
Assistant Examiner—Joseph L. Dixon
Attorney, Agent, or Firm—Dale Gaudier

[57] ABSTRACT

A digital instrument is represented by an analog-to-digital converter 17 controlled by a CPU 10 to effect measurements at regular intervals. The digital measurements are stored in a history file in a RAM 14, e.g. the most recent 100 or 500 measurements. The measurements are also linearly processed by rounding and range scaling to produce 100 reduced measurements in a second file in the RAM 14. This file is cyclically read out to a digital-to-analog converter 18 to produce a voltage on a terminal 22 for application to an oscilloscope which provides a display from which features of the measurements (e.g. a trend or a periodic component) can be seen. In order to allow for flyback and reset the 100 reduced measurements are held in a file of larger capacity (e.g. 130 or 150 measurements) which is cyclically read out. As the oldest of the 100 measurements is read a driver 19 provides a trigger pulse on a terminal 23 for the oscilloscope external trigger input. Various linear and non-linear algorithms for deriving the second file from the history file are described.

14 Claims, 4 Drawing Sheets

DATA DISPLAY METHOD AND APPARATUS

FIELD OF THE INVENTION

The present invention relates to a data display method and apparatus which may be used in conjunction with a variety of instruments which provide a series of digital measurements. Examples of such instruments are data loggers and frequency response analyzers and, of especial interest, digital meters such as digital voltmeters (DVMs) and digital multimeters (DMMs).

PRIOR ART

It is already known in microprocessor-based digital meters to provide a "history file" consisting of a block of RAM in which a substantial number of past measurements are stored for recall and analysis.

The present invention is concerned with an improvement whereby the user of a digital instrument can obtain an immediate visual indication of measurement history showing, for example, a trend in a measurement, a periodic component contaminating a measurement, and so.

SUMMARY OF THE INVENTION

According to the present invention, there is provided data display apparatus comprising a digital instrument operative under the control of a processor to effect a series of measurements. A random access memory includes a block of memory locations storing data derived by the processor from the measurements. The said memory locations are read out in cyclic sequences to a digital-to-analog converter to provide a signal at the output of the converter representing, as an analog function of time, information pertaining to the series of measurements.

The signal at the output of the digital-to-analog (D-A) converter is intended for application to an oscilloscope.

If the apparatus uses a history file in the RAM, this file or a part thereof may constitute the said block of memory locations. However it is preferable for this block to form a second file which may be called the scope file since it stores the data from which the oscilloscope input signal is created. The samples in the scope file are derived in accordance with a predetermined algorithm from the samples in the history file and many alternative algorithms may be devised. In the embodiment which is described in detail below the two files have the same number of samples and each scope file sample is derived from the corresponding history file sample by rounding the data to a substantially lower resolution (1 byte as against 6) and linear processing to effect range scaling. The purpose of this is to establish a standard digital input range to the D-A converter regardless of the range of the measurement samples.

The two files do not necessarily have the same number of samples. There is currently a trend to even larger history files, say 500 samples. The scope file may hold fewer samples, say 100 samples, which may be derived from a block of consecutive samples in the history file (which block may be movable as a window through the history file). Alternatively the scope file samples may be derived from every $n^{th}$ history file sample where n may be a fixed number such as 4 or 10 or a presettable number. Each scope file sample may be a simple average or other function of n history file samples.

Whether the scope file has less, the same or more samples than the history file, the scope file can go back further in history than the history file. An example of this would arise with a history file of 500 samples and a scope file of 100 samples derived from every 10th history file sample. Such an example would be useful for studying long-term drift of a measurement.

As so far described the scope file samples are derived by linear operations and selection operations. This is not a necessary constraint. The scope file locations may for example hold frequency distribution values and each history file sample be assigned to a range bin with consequent incrementing of the scope file location pertaining to that bin. The oscilloscope display will then be a histogram display showing the distribution of occurrence of measurement values.

In the embodiment to be described the updating of the scope file is a real time operation taking place in conjunction with the taking and storing of the measurements in the history file. Again this is not a necessary constraint. Provided it is not required to have a longer history than the history file itself, the scope file can be created on demand and the user may be given the facility to select between different algorithms for the derivation, e.g. to modify the range scaling or select between different kinds of display such as analog display of sample values and a frequency distribution histogram display. A DMM commonly has a MAXMIN function for finding and displaying maximum and minimum peak values of the input signal. These could be used as the limits of the range to be range-scaled on to the range which is input to the D-A converter in correspondence with a full scale oscilloscope deflection.

BRIEF DESCRIPTION OF THE DRAWINGS

Further features of the invention and the method according to the invention are defined in the appended claims.

The invention will be described in more detail, by way of example, with reference to the accompanying drawings, in which.

DESCRIPTION OF THE PREFERRED EMBODIMENTS

Figure 1:
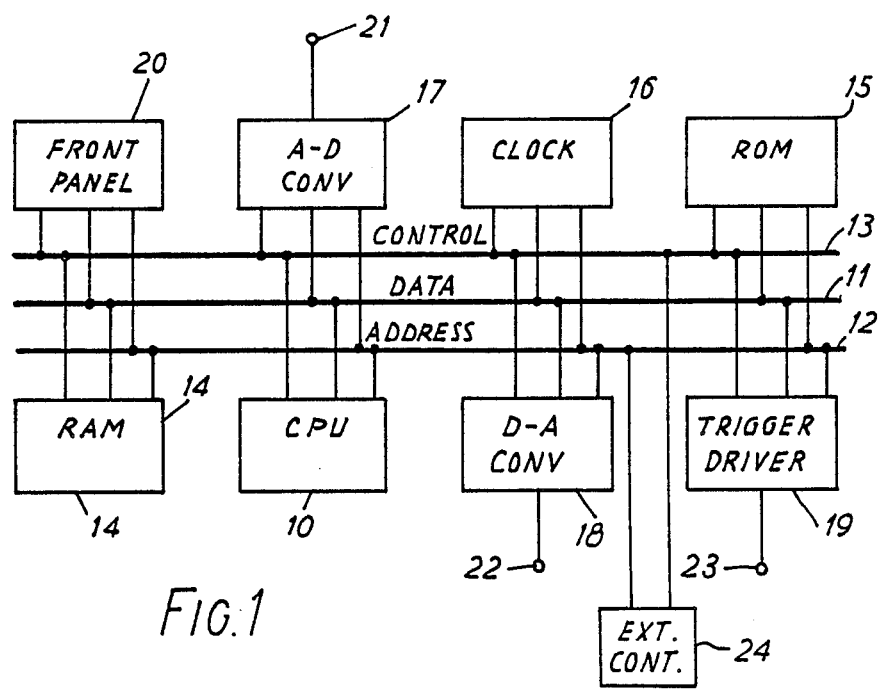
FIG. 1 is a block diagram of apparatus embodying the invention.

The apparatus shown in FIG. 1 utilizes a standard microprocessor configuration with a CPU 10 connected to a plurality of devices by a data bus 11, an address bus 12 and a control bus 13 containing one or more system clock lines, read select and write select lines, one or more interrupt lines and other lines as dictated by the requirements of the CPU 10. The CPU may be one of the widely available 8-bit (or equally 16-bit or 32-bit) microprocessor chips. The 6801 microprocessor chip (from the 6800 family) has been used by the applicant. The data bus 11 is an 8-bit bus and the address bus 12 may be a 16-bit bus.

The devices connected to the CPU comprise a RAM 13, a ROM 15 storing the routines whereby the CPU is enabled to perform the required functions, and a real-time clock 16 which provides interrupts to the CPU 10 to enable it to perform its main input and output schedules at the required intervals, as described below. Further peripheral devices comprise an analog-to-digital (A-D) converter 17, a digital-to-analog (D-A) converter 18 and a trigger driver 19, whose functions are explained below, and a front panel 20 provided with switches and/or a key-pad to enable the user to set the mode of the apparatus, rate at which readings are taken, the input range and so on. Although not shown the peripheral devices will typically also include a display device for showing one-shot readings, averaged readings and so on and a printer may be provided for hard-copy output. The invention is not concerned with these conventional facilities. The CPU is interrupt driven firstly by regular interrupts from the clock 16 and secondly by interrupts from the front panel 20 when the user is entering parameters (in the same way as a typical microcomputer uses keyboard interrupts).

The basis of operation is as follows. The test voltage on a terminal 21 is applied to the A-D converter 17 which is sampled once per measurement period to provide a new measurement to be stored in a 'history file' in the RAM 14. The history file is a block of RAM locations enabling the most recent 100 or 500 (for example) samples to be stored using six bytes per sample. This is at substantially measurement accuracy, e.g. in floating point representation. Later on the data is reduced to one byte per sample for scaled display. For simplicity it will be assumed that 100 samples only are stored and that the RAM block starts at address 0, i.e. it runs from address 0 to address 599. A different start address merely requires a fixed offset to be added to all the addresses given herein. The samples are thus continuously written into the addresses 0, 6, 12 ... 588, 594, 0, 6 ... and on in cyclic sequence.

The 100 samples stored in the block 0–599 are processed in a manner to be explained and stored one byte per sample in a further block of memory locations which is actually of length 150 bytes and is taken to be the block 600–749. This block is repeatedly read out to the D-A converter 18 with a read cycle time of say 200 $\mu$s and a voltage is thereby made available at an output terminal 22 for application to an oscilloscope. The trigger driver 19 is used to provide a pulse marking the oldest read-out sample for application to the external trigger input of the oscilloscope. The oscilloscope trace is thus a representation of the last 100 measurements and the user can see from this trace such features as main interference components in the test signal, a trend of the test signal, and so on.

It must be emphasised that the embodiment under detailed description is assumed to operate under continuous input with derivation of the values stored in the second file 600–749 by linear operations on values taken from the history file 0–599. As already indicated, other modes of data derivation are possible and the second file values may be representative of respective measurement types and be maintained to store the numbers of the respective measurement types made to date. In such a case the oscilloscope cycle will be synchronized with a fixed read-out cycle of the second file and a histogram type of display will be generated. As an example of this, consider the instrument used to measure resistors. Each second file address could represent a value, e.g. 0.950K, 0.951K ... 1.49K, 1.50K in 0.001K steps. Measurement of a batch of nominally 1K resistors would yield measurements within this range and a count could be kept of each measurement falling within each range against the corresponding file address. The histogram function of the instrument allows the spread to be clearly displayed when the file is clocked out to the oscilloscope.

The addressing of the history file and the following block, which will be called the scope file will now be considered in more detail. The addressing of the history file is straightforward. The CPU 10 uses an address in the RAM 14 as a cyclic counter counting $[N]_C$ symbolizing n mod 100. In each measurement period the latest measurement is written into the address locations $6[N]_C$ to $6[N]_C+5$ and N is incremented. The measurement period need bear no relation to the read-out period from the scope file. It is set up from the front panel 20.

The latest measurement is processed to provide the corresponding one-byte sample which will be called a reduced sample. This is written into address location $600+[S]_{CL}$ where $[S]_{CL}$ means S mod 150, the address location $600+[S-100]_{CL}$ is notionally cleared and S is incremented. S is a count value in another RAM address. This addressing scheme means that the scope file always holds the most recent 100 reduced samples in a block of 100 addresses which shifts progressively through the 150 addresses of the scope file. Consider commencing to fill the scope file from an empty state with S=0. The reduced samples will go into locations 600, 601, 602, ... 698, 699. the next sample will go into location 700 and location 600 will be notionally cleared so that the sample block extends from address 601 (oldest sample) to address 700. The next sample will go into location 701 and location 601 will be cleared so that the sample block extends from address 602 (oldest sample) to address 701.

In practice the address location $600+[S-100]_{CL}$ is not cleared. The second scope file actually holds the last 150 reduced measurements but only the last 100 are displayed. The time base of the oscilloscope spans the location marked by the trigger pulse and the next 99 locations, in the second file read-out cycle. The other 50 samples are off the screen.

The scope file read-out period is established quite independently of the read-in cycle by another counter counting T mod 150. The read-out address is thus given by $600+[T]_{CL}$. A read-out is effected and T is incremented once every 200 $\mu$s. Only 100 addresses contain displayed data, corresponding to an active 20 ms ($100\times200$ $\mu$s) waveform followed by a 10 ms ($50\times200$ $\mu$s) blanking interval corresponding to the un-displayed 50 addresses, within which the oscilloscope effects flyback and reset ready for the next trigger pulse on the terminal 23.

The trigger pulse is required to occur in coincidence with the reading of the oldest sample from the scope file and this occurs when $T=S-100$. At this instance the driver 19 is enabled to provide the trigger pulse with a duration which may be hardware or software controlled.

The processing of the measurement samples to provide the reduced samples is an elementary range scaling operation with compression of data to 1-byte. The D-A converter 18 is a typical commercially available 8-bit device with digital input range 0 to 255 and corresponding analog output range 0 to 2.55 volts or 0 to 10 volts. The former alternative will be used below. The value 128=(1.28) volts is used as an offset zero establishing the midpoint of the range to be displayed with 28 as the negative full scale deflection (fsd) and 228 as the positive fsd, giving a resolution of 100 points plus and minus.

The displayed measurement span extends between two arbitrary values selected by the user on the front panel 20 and stored as MAX and MIN in assigned RAM locations. The displayed measurement span is thus MAX-MIN which has to be mapped on to the D-A converter input span of 228 to 28. Let the measurement sample and reduced sample be M and R respectively. The standard range scaling equation is $$R = a + bM$$

which becomes
  $228 = a + b.MAX$
  and $28 = a + b.MIN$
when M=MAX and M=MIN respectively.

These simultaneous equations are readily solved to yield the scale factor b=200/(MAX-MIN) and the offset a=288- 200 MAX/(MAX-MIN). The range scaling equation actually applied is thus $$R = 228 + 200(M - MAX)/(MAX - MIN).$$

After applying this equation the reduced sample R is rounded to one byte.

The oscilloscope is set up so that about 2½ volts peak to peak fills the display vertically while the time-base is set so that about 20 ms (100×200 μs) fills the screen horizontally.

Figure 2:
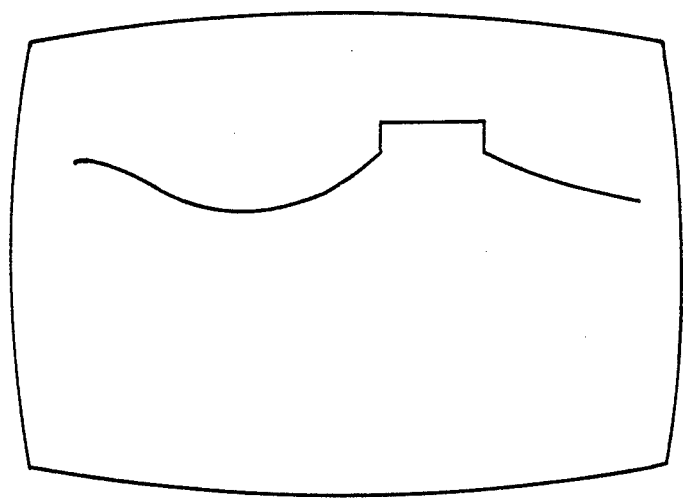
FIG. 2 shows the sort of display which might be provided using the apparatus of FIG. 1, and FIGS. 3 to 5 are flow charts showing the operation of the apparatus.

Any input value above MAX is stored as R=255 and any input value below min is stored as 0 so that out-of-range values are clearly shown on the oscilloscope display. By way of example FIG. 2 shows the sort of display when the test voltage is a steady voltage near to MAX contaminated by a periodic component which intermittently takes the voltage over MAX.

For convenience, the microprocessor may be programmed to generate a test pattern on turn-on, to facilitate setting up the oscilloscope. For instance, data may be put into the scope file as follows: 20 samples representing MAX, 20 samples equal to 255 (representing a positive over-voltage), 20 samples representing the mid-point of the span, 20 samples equal to 0 (representing a negative over-voltage) and finally 20 samples representing MIN. In this way a step-like test pattern will be produced, extending over the whole range of output voltages and the whole time base. The oscilloscope controls can then be set so that the whole pattern is displayed and the step representing the mid-point of the span is positioned at a particular graticule, for instance. A suitable command entered through the keyboard would then cause the microprocessor to commence normal operation.

Figure 3:
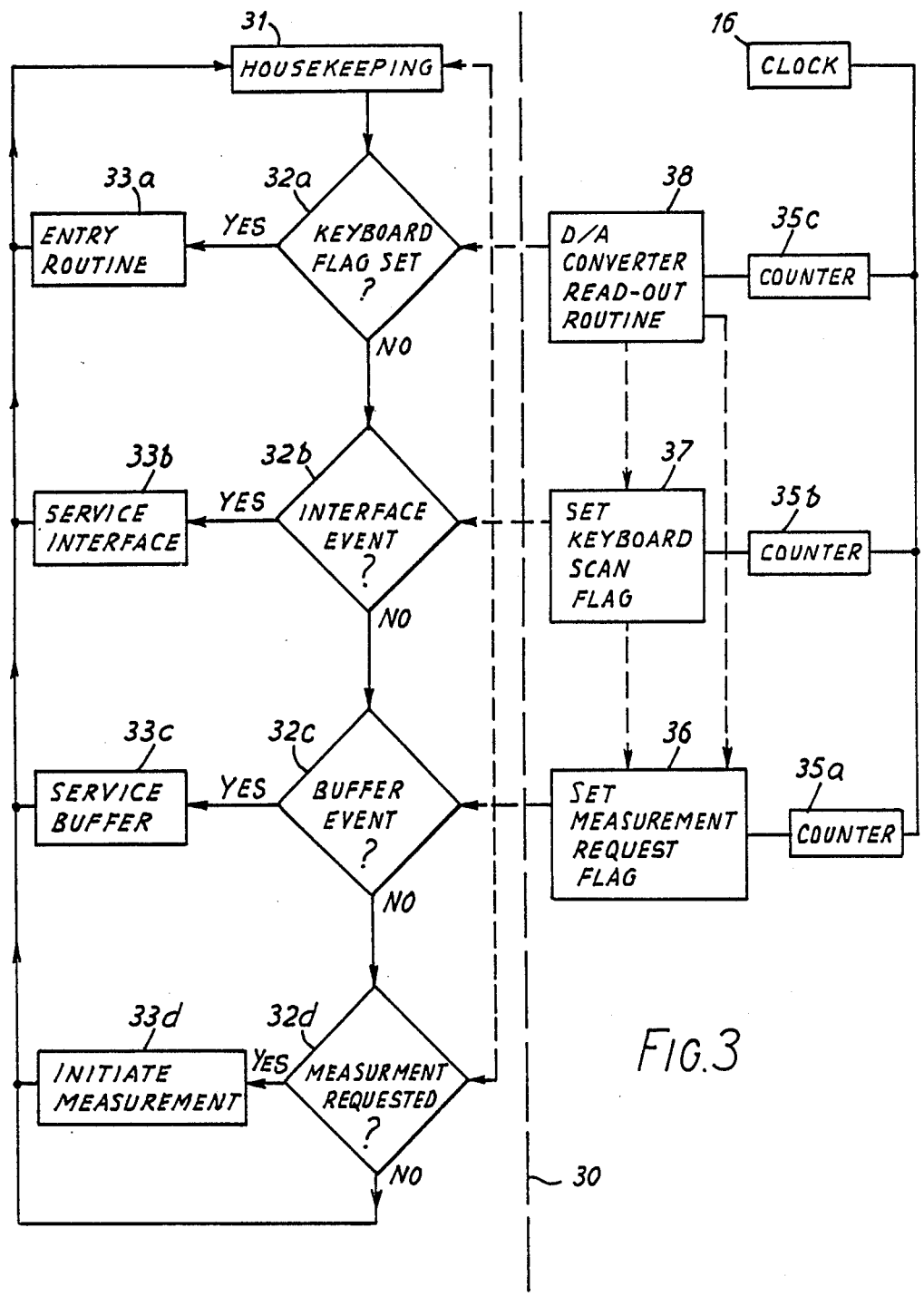
Figure 4:
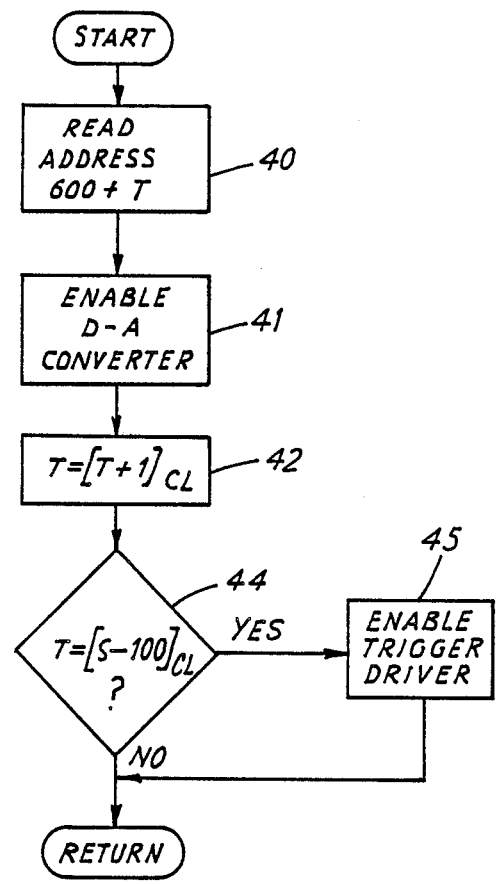
Figure 5:
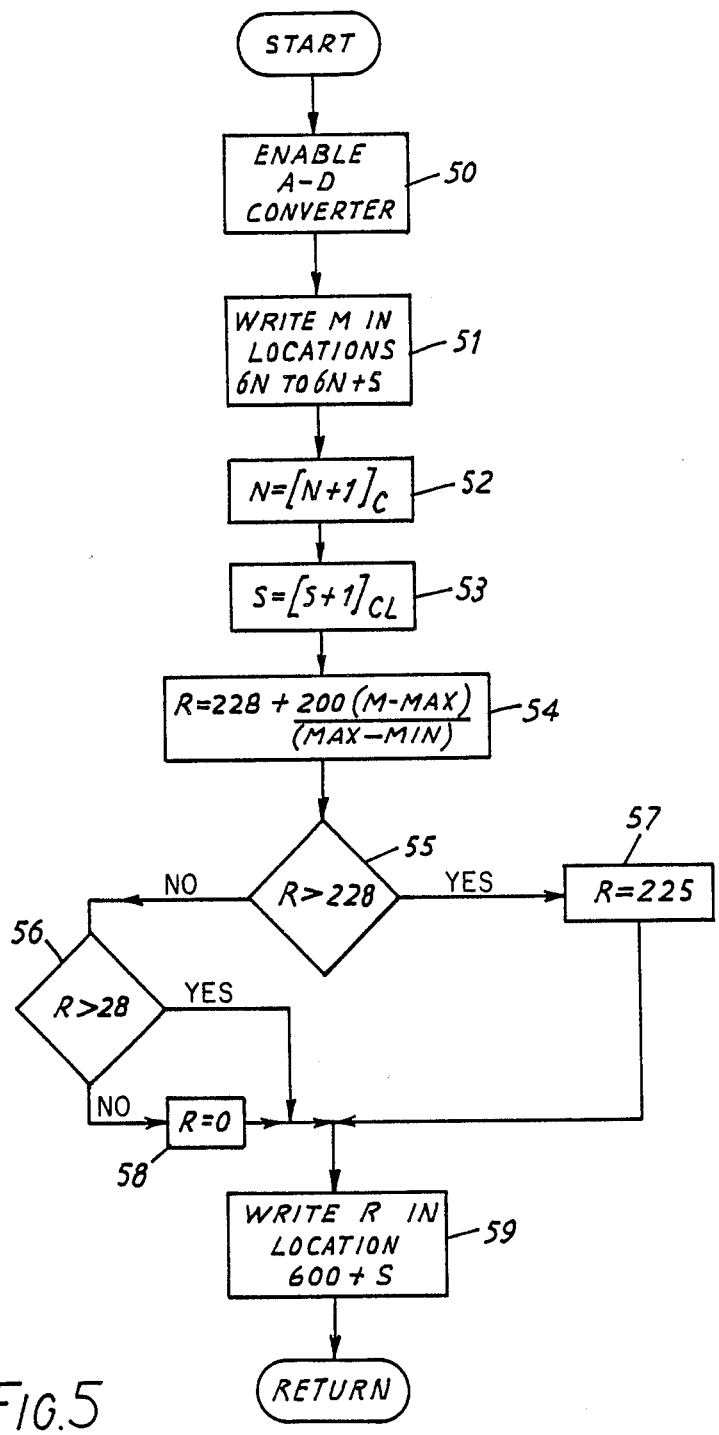

The implementation of the operations described above is set forth in the flow charts constituting FIGS. 3 to 5. FIG. 3 shows the basic software structure. A monitoring routine is shown to the left of the broken line 30, and is continuously executed. A housekeeping routine 31 performs tasks such as checking if a measurement has been completed, and if so updating the history and scope files in the manner already described. Output to peripheral devices such as a printer, if present, is provided by the routine 31.

Following the completion of the housekeeping routine 31, up to four of the tests 32a, 32b, 32c, 32d are performed. Firstly, the CPU determines if a keyboard flag has been set (in a manner to be described later) to indicate that a key of the keyboard has been operated. In the affirmative, an entry routine 33a is executed to read and enter an input from the keyboard and to respond to it.

If the keyboard flag has not beet set, the CPU checks at 32b for the occurrence of an event on its interface (which may be, for instance, a standard RS232 interface) and, in the affirmative, executes a routine 33b to service the interface and respond to the event. The routine then returns to the housekeeping routine 31.

In the absence of an event on the interface, the CPU checks at 32c for the occurrence of an event on its buffer (which may be, for instance, a standard GPIB buffer) and, in the affirmative, services the buffer at 33c, responds to the event, and returns to the houskeepng routine 31.

The provision of separate routines for servicing the two different types of event is purely a convenience in one practical implementation. There is no fundamental difference between an interface event and a buffer event.

If the three tests 32a, 32b, 32c have all been answered in the negative, the CPU checks at 32d for a flag having been set to request initiation of a measurement. If so, a measurement is initiated at 33d. After initiating a measurement, or if the flag is not set, the monitoring routine recommences at 31.

Unless execution of any of the steps 33a, 33b, 33c and 33d is required, a cycle of the monitoring routine only comprises the housekeeping routine 31 and the four tests 32a, 32b, 32c, 32d, and so is very short.

No time is spent reading input from the keyboard, for instance, unless the appropriate flag has been set, to alert the CPU that this operation is required.

The clock 16, shown to the right of the broken line 30, supplies clock pulses to three counters 35a, 35b, 35c. When the counter 35a reaches a predetermined count, an interrupt routine 36 is executed to set the flag which requests initiation of a measurement. A routine for setting a flag can be very short and quickly executed. The monitoring routine on the left hand side of FIG. 3 can be interrupted at any time to allow execution of the routine 36, even during the execution of the routines 33a, 33b, 33c, 33d. This is indicated by the broken arrows from the box 36 to several parts of the monitoring routine. These broken arrows indicate the sending of an interrupt signal and do not indicate flow paths through the flow diagram. The counter 35a is reset to zero by the routine 36.

Blocks 35a and 36 are employed only when periodic measurements are required and the computer is interrupt driven to achieve this. Periodic or intermediate measurement requests may equally well be made under control of an external controller 24 which generates an interrupt requiring the computer 10 to service the current digital measurement at the output of the A-D converter 17.

A second counter 35b regularly initiates execution of a second interrupt routine 37 which looks for operation of any key of the keyboard, in which case the flag requesting execution of the routine 33a is set. The routine 37 does not read the input from the keybaord, but merely determines if the keyboard is in use, and the routine is therefore short and quickly executed. The routine 37 can interrupt the monitoring routine at any time, and can also interrupt the routine 36, so that recording a request for a keyboard scan has a higher priority than recording a request for measurement initiation. The clock 35b is reset to zero by the routine 37.

A third counter 35c regularly triggers execution of a third interrupt routine 38 which transfers data to the D-A converter for read-out. Again, the routine 38 is short and quickly executed. The routine 38 can interrupt the monitoring routine at any time, and can also interrupt the routines 36 or 37 if either is being executed, so that the routine 38 has the highest priority of the three interrupt routines 36, 37, 38. The routine 38 resets the counter 35c to zero.

The entry routine 33a is not essential to operation of the invention since all parameters could be fixed. However, the routine is desirable because it enables parameters such as MAX and MIN and so on to be selected from the front panel. Each such parameter will be stored in one or more specific address locations and the entry routine is a standard type of keyboard entry routine as is well known in microcomputers and microprocessor-based instrumentation.

The read-out routine 38 is shown in FIG. 4. The routine starts by reading (40) address 600+T. Then the D-A converter 18 is enabled (41); the converter latches in the new digital value and provides the corresponding analog output on terminal 22. T is incremented (42) and reset to zero if T=150. A test 44 is made to ascertain if $T=[S-100]_{CL}$. In the affirmative the trigger drive 19 is enabled (45) to provide an oscilloscope trigger pulse.

The measurement routine (FIG. 5), initiated at 33d (FIG. 3) starts by enabling the A-D converter 17 (50). This converter is preferably of the type described in the applicant's UK Pat. No. 1434414 and is arranged to produce a high precision, 6 byte, digital measurement result. When the measurement has been completed, the bytes are read one by one (51) on the 8-bit data bus 11 into memory locations $6[N]_c$ to $6[N]_c+5$. then the value of N is incremented to $[N+1]_c$ at 52, and S is incremented to $[S+1]_{CL}$ at 53. Then the range scaling equation is applied (54) to calculate R from M. Decisions 55 and 56 and operations 57 and 58 deal with out of range values of R and then R is written (59) into memory locations 600+S. Although not necessary in practice, the memory location $600+[S-100]_{CL}$ may actually be cleared, if desired.

It has been assumed that file-updating is implemented as part of the interrupt-driven D-A converter read-out routine 38. This is convenient under continuous input but not essential. Updates may be effected independently of read-outs, e.g. using direct-memory access, which may be access by another processor.

What is claimed is:

1. Apparatus for generating a signal for application to a data display apparatus comprising:
    a digital instrument under the control of a processor including means for making a series of measurements:
    a random access memory electrically coupled to the processor and including a block of memory locations for storing data derived by the processor from the measurements in accordance with a predetermined data reduction algorithm:
    a digital-to-analog converter electrically coupled to the memory; and means for reading out said memory locations in cyclic sequence to the converter to generate a signal at an output of the converter for application to the display apparatus; the data reduction algorithm being chosen such that the generated signal represents as an analog function of time information pertaining to the series of measurements.

2. Apparatus according to claim 1, wherein the memory further includes a portion for storing a history file consisting of a plurality of values derived from measurements made by the digital instrument, and said block of memory locations comprises a second file for storing values selectively derived from the values in the history file in accordance with the predetermined algorithm.

3. Apparatus according to claim 2, whrein the predetermined algorithm derives the second file values from he history file values by a means of a linear operation.

4. Apparatus according to claim 2, wherein the second file values are representative of the numbers of predetermined types of measurements made to date.

5. Apparatus according to claim 2, wherein the predetermined algorithm creates a frequency distribution function from the history file values.

6. Apparatus according to claim 2 and wherein the second file is stored in memory with a resolution less than the stored history file.

7. Apparatus according to claim 6 and wherein the range of measurements stored within the second file is selected to be a part of the range of values stored in the history file.

8. Apparatus according to claim 7 and wherein the part of the range of values stored in the history file that is stored in the second file is offset with respect to zero.

9. Apparatus according to claim 1, wherein the data in the block of memory locations consists of values derived in sequence by the central processor and written into the memory locations in accordance with a cyclic sequence of addresses.

10. Apparatus according to claim 9, wherein the processor is arranged during each read-out cycle to cause output of a trigger signal marking read-out of an oldest value from the block of memory locations.

11. Apparatus according to claim 10, wherein the addresses from the marked oldest value up to the newest written-in value cover a proportion only of the complete block of memory locations.

12. Apparatus according to claim 1, wherein the digital instrument is a digital metering instrument.

13. A method of displaying a signal comprising the steps of:
    (a) sampling the signal;
    (b) deriving from said sampled signal a succession of first digital values representative of the signal;
    (c) storing successive ones of said digital values as a history file;
    (d) deriving from the values stored in step (c) a plurality of second digital values, said second digital values being derived in accordance with a predetermined data reduction algorithm;
    (e) storing said second digital values as a second file separate from said history file;
    (f) cyclically reading out said second digital values and converting said second digital values to analog signals representative of said second digital values; and
    (g) applying said analog signals to a scanning type display device.

14. The method of claim 13 wherein steps (a) through (g) take place substantially in real-time, whereby said analog signals are substantially instantaneously displayed after sampling of said signal takes place.

* * * * *